United States Patent [19]

George

[11] 4,078,230
[45] Mar. 7, 1978

[54] MULTI-SEGMENT DETECTOR

[75] Inventor: Peter K. George, Placentia, Calif.

[73] Assignee: Rockwell International Corporation, El Segundo, Calif.

[21] Appl. No.: 654,677

[22] Filed: Feb. 2, 1976

[51] Int. Cl.² .............................................. G11C 19/08
[52] U.S. Cl. .......................................... 365/8; 365/43
[58] Field of Search ................................ 340/174 TF

[56] References Cited

U.S. PATENT DOCUMENTS 3,979,738  9/1976  Feuersanger et al. ........ 340/174 TF

Primary Examiner—James W. Moffitt

Attorney, Agent, or Firm—H. Fredrick Hamann; G. Donald Weber, Jr.

[57] ABSTRACT

A plurality of stretcher detector segments are connected in series whereby detector signals generated when a bubble passes thereby are added together. Each of the stretcher detector segments is disposed an identical propagation distance away from passive replicators wherein bubbles are replicated from a propagation path and applied, simultaneously, to the stretcher detector segments. The stretcher detector segments are arranged to include both dummy and active portions thereof which are arranged to permit the geometry of both the dummy and active portions of the segment to be substantially matched.

12 Claims, 3 Drawing Figures

MULTI-SEGMENT DETECTOR

The invention described herein was made in the performance of work under NASA Contract No. NAS 1-12981 and is subject to the provision of Section 305 of the National Aeronautics and Space Act of 1958 (72 Stat. 435; 42 U.S.C. 2457).

BACKGROUND

1. Field of the Invention

This invention relates to bubble domain detectors and, in particular, large output, chevron stretcher detectors capable of reading a first bit, as well as subsequent bits, adjacent to the detection element in a start/stop mode.

2. Description of Prior Art

There are many known bubble domain devices and systems in the art. These systems and devices are fabricated on various types of magnetic bubble domain supporting material. One of the existing materials is SmGaYIG. In this type of material, for example, as well as others, it is known that due to finite wall mobility of a strip or a bubble the expansion of a bit in a long chevron stretcher detector requires several rotating field cycles. For example, expansion rates for 16 $\mu$ devices indicate that in one field rotation the bubble strip expands about 100 chevrons. Typical sensitivities for this length of stretch or expansion are about 1.10 mv./ma. As a result, the output signals produced by these devices are limited to about 5 mv. at room temperature or about 2.5–3 mv. over a temperature range of approximately $-10°$ to $+70°$ C. Consequently, the associated sense amplifier is limited to having a threshold below 2.5 mv. which restricts the choice of integrated circuit and limits the signal to noise ratio.

Moreover, it is highly desirable that this relatively large output signal be provided within the first cycle after start-up (when the memory is operated in the start-stop mode.) That is, it is desirable to be able to detect the bit immediately adjacent to the detector upon energizing the rotating fields coils. Simply making the detector longer than 100 elements fails to accomplish this goal because the bubble mobility limits the strip length to 100 or less over the operating bias range.

SUMMARY OF THE INVENTION

Passive replicators are utilized to replicate bubbles from a propagation path of the typical bubble domain system to output paths leading to a plurality of stretcher detector segments. The output paths to the stretcher detector segments are identical in length. All of the stretcher detector segments are connected in series, wherein the signals detected across each detector segment are combined additively.

In a preferred embodiment, the detector is fabricated in a manner wherein both the dummy and the active portions are matched substantially exactly and in a minimum of layout space to provide an advantageous detector structure.

DESCRIPTION OF THE PREFERRED EMBODIMENT

Figure 1:
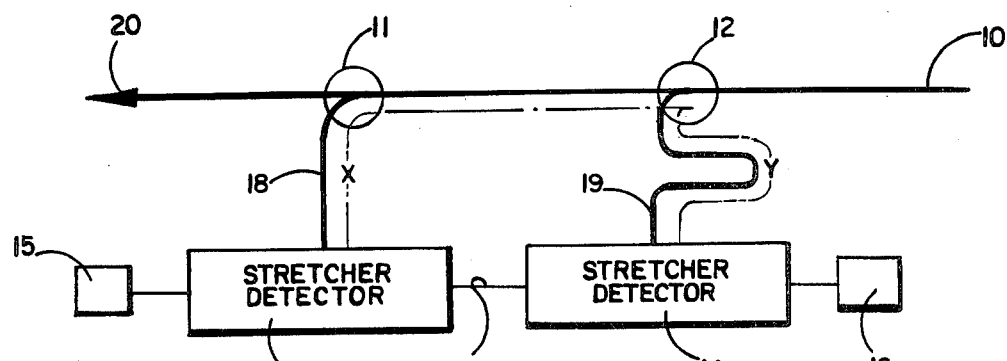
FIG. 1 is a schematic representation of the multiple-section stretcher-detector contemplated in this invention.

Referring to FIG. 1, there is shown a schematic representation of a bubble domain detector contemplated by this invention. Initially, it is assumed that the elements shown in FIG. 1 are appropriately disposed relative to a bubble domain supporting material (not shown). Any suitable material, such as garnets, may be utilized. Propagation path 10 is any suitable propagation path such as is comprised of permalloy chevrons, X-bars, T-bars, or the like. Any other type of propagation path such as a channel or the like is also contemplated. It is considered that propagation path 10 comprises a portion of a propagation path in a bubble domain system wherein the type of system is not a portion of the invention, per se. In this embodiment, bubbles propagate in the direction shown by arrow 20 although, with proper arrangement of the various elements or components, the system can operate on bubbles which propagate in either direction.

Replicators 11 and 12 are passive replicators of any suitable design, many of which are known in the art. Passive replicators 11 and 12 are arranged to replicate bubbles which are propagating along propagation path 10. Particularly, replicator 12 causes bubbles in path 10 to continue to propagate therealong and, as well, to be transferred to output propagation path 19. In a like manner, replicator 11 permits bubbles to propagate along path 10 and, as well, to be transferred to output propagation path 18.

Output propagation path 19 is associated with and connected to stretcher detector segment 14. Similarly, output propagation path 18 is associated with and connected to stretcher detector segment 13. Stretcher detectors 13 and 14 comprise any of the suitable stretcher detector devices, several of which are known in the art. For example, reference is made to a publication by Bobeck et al in IEEE Transactions on Magnetics, Vol. Mag.-9, No. 3, September 1973, pp. 474–480. Also, reference is made to U.S. Pat. No. 3,713,120 to Bobeck er al.

The appropriate detector lines, such as permalloy magnetoresistance lines of the stretcher detectors 13 and 14, are connected together by line 17 which is of similar material. The other ends of the detector lines of detector sections 13 and 14 are connected to bonding paths 15 and 16, respectively. Each of bonding pads 15 and 16 may be any suitable terminal arrangement which is connected to other portions of the bridge network and the like through which detection actually takes place. Output propagation paths 18 and 19 are shown in relatively stylized configuration. However, any suitable configuration is intended to be included. It must be understood that the distance X between passive replicator 12 and stretcher detector 13 must be identical to the distance Y between passive replicator 12 and stretcher detector 14. With these paths identical in length, it is assured that bubble domains will reach detector segments 13 and 14 at the same time. In particular, a bubble propagating along propagation path 10 can be replicated into output propagation path 19 and propagated therealong as the original bubble propagates along path 10 and output propagation path 18. Since the distances X and Y are identical, the propagation time will be identical as well. Consequently, when a bubble replicated from path 10 by replicator 12 to output propagation path 19 is detected as detector section 14, a counterpart presentation of the same bubble will have been propagated along path 10, replicated by replicator 11, propagated along path 18 and concurrently detected at stretcher detector segment 13. Inasmuch as each of the stretcher detectors is detecting a bubble simultaneously, the signal detected by the sections is additively combined. By making the stretcher detector sections equal, the output signal produced by the detector is effectively doubled. Consequently, if stretcher detectors 13 and 14 are constructed of the maximum effective size (e.g. 100 chevrons) to which a bubble may be expanded during a single rotating field cycle, an output signal of twice the magnitude can be obtained across terminals 15 and 16. Thus, the signal output from the detector in the start-stop mode of operation may be doubled for first bit of detection. In a similar fashion it may be tripled or the like.

Figure 2:
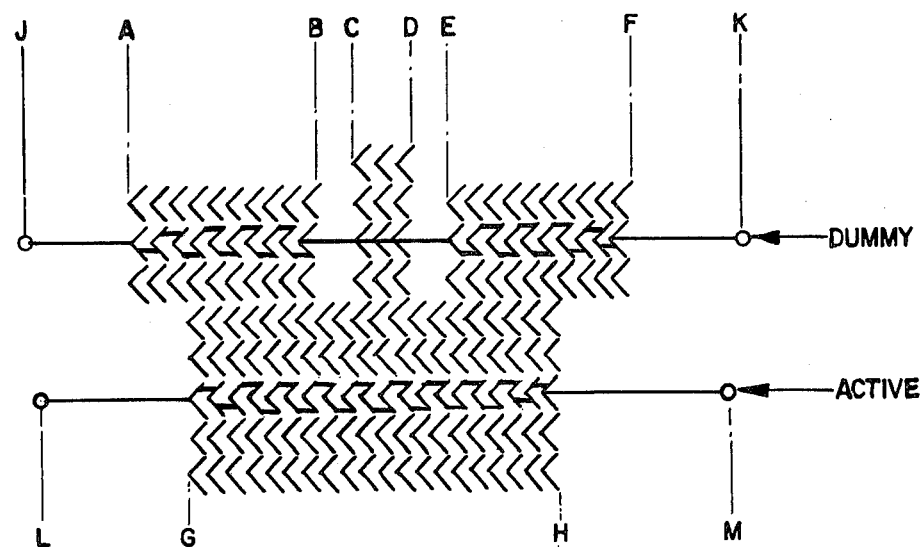
FIG. 2 is a diagramatic representation of a segment of the stretcher-detector.

Referring now to FIG. 2, there is shown a single segment of a stretcher detector and a preferred configuration to permit precise magneto-resistive matching of dummy and active portions of the detector section comprises dummy and active portions. The construction of the dummy and active portions is any of the well known chevron stretcher detector configurations. In particular, the embodiment shown utilizes the zig-zag configuration (see the references listed supra.) That is, a plurality of chevrons are arranged wherein the bubble is to be stretched. The opposite ends of the chevrons are alternately connected wherein a zig-zag configuration is obtained. However, the dummy portion of the detector segment is split apart and an active propagation path is inserted between and spaced from the separated portions of the dummy section.

The active propagation path is connected directly to the active portion of the stretcher detector which is disposed immediately adjacent to the dummy portion of the section. With this configuration, a bubble to be detected is propagated along the active propagation path to the active portion of the detector section. The bubble is stretched in the active portion of the detector and propagates across the detector line wherein detection is obtained. Inasmuch as the propagation path contains only three chevrons, little or no output signal is developed in the dummy.

By assuring that the split apart portions of the dummy section are, cumulatively, equal in length to the active portion and by assuring that the length of the detector line portions of the dummy section are equal to the combined portions to the detector line of the active section, the dummy and the active portions of the section can be substantially exactly matched.

In particular, referring to FIG. 2, the combined length of the dummy sections AB and EF must be equal in length to the active section GH. In addition, the length of the detector line portions JA + BE + FK in the dummy section can be arranged to be substantially identical to the length of the detector line portions LG and HM in the active portion.

That portion of the propagation path CD may introduce some minimal variation relative to the straight sections (e.g. BC). However, experimentation indicates that the effect is small.

Figure 3:
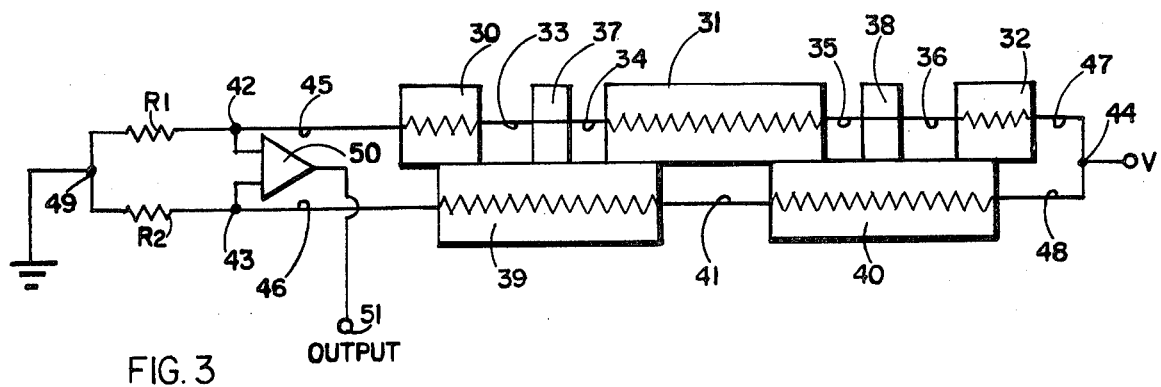
FIG. 3 is a partially diagramatic, partially schematic, representation of a plurality of detector segments connected together as part of a bridge network.

Referring now to FIG. 3, there is shown an arrangement wherein a pair of sections, such as shown in FIG. 2, are connected together in accordance with the embodiment shown in FIG. 1 to provide a detector with improved start/stop sensitivity. Thus, the dummy portion comprises chevron blocks 30, 31 and 32 which are connected together by detector lines 33, 34, 35 and 36. Input paths 37 and 38 are also provided. Path 37 is disposed between and spaced from chevron blocks 30 and 31 while path 38 is disposed between and spaced from chevron blocks 31 and 32. Detector lines 33 and 34 may be considered to extend through and be joined as a single line at path 33. Similarly, detector lines 35 and 36 may be considered to be connected together at path 38.

The active portions comprising chevron blocks 39 and 40 are connected together by detector line 41. Chevron block 39 is also joined with propagation path 37 while chevron block 40 is joined with propagation path 38. Magnetic bubble domains thus pass from the propagation path to the connected chevron blocks 39 and 40. The chevron blocks of the dummy and active portions may be allowed to overlap as shown. This allows the dummy and active portions of the detector to be closely spaced which facilitates magnetoresistive matching.

In order to establish a bridge type network for the detector, resistors R1 and R2 are connected together at one end thereof at terminal 49. Terminal 49 is connected to a suitable source or reference potential, for example ground. Another terminal of resistor R1 is connected to terminal 42 while another terminal of resistor R2 is connected to terminal 43. Terminal 42 is connected to chevron block 30 via detector line 45. Terminal 43 is connected to chevron block 39 via detector line 46. Obviously, detector lines 45 and 46 are connected to detector lines in the chevron blocks and are essentially continuations or projections of detector lines 43 and 41, respectively.

Similarly, terminal 44 which is connected to receive a reference potential, for example +V, is connected to chevron blocks 32 and 40 via detector lines 47 and 48, respectively. Again, these detector lines are connected through the associated chevron blocks (see references noted supra) to other portions of the detector line whereby a continuous detector line (active portion) is connected from terminal 43 to terminal 44. In addition, a continuous detector line (dummy portion) is connected between terminals 42 and 44.

A suitable differential amplifier 50 has the input terminals thereof connected to terminals 42 and 43, respectively, of the bridge network. The output terminal of amplifier 50 is connected to terminal 51 to produce an output signal. Thus, amplified output signals indicative of the detector signal produced across chevron blocks 39 and 40 are obtained at terminal 51.

Referring to FIGS. 1, 2 and 3 concurrently, it is clear that input paths 37 and 38 (FIG. 3) are counterparts of the input path (C-D) shown in FIG. 2. These input paths are portions of the propagation paths 18 or 19 shown schematically in FIG. 1. The stretcher detector segment shown in FIG. 2 comprising both dummy and active portions is represented by either stretcher detector 13 or 14 in FIG. 1. Conversely, it may be considered that only the active portion of this combination is shown in FIG. 1. The chevron blocks 30, 31, 32, 39 and 40 in FIG. 3 are representive of a plurality of the sections shown in FIG. 2.

Thus, there has been shown and described a preferred multiple bubble detector of the stretcher detector variety. The detector is shown and described in a preferred configuration whereby an improved output signal operation is achieved for the start/stop mode of operation. In accordance with the overall detectors suggested in FIGS. 1 and 3, an output signal having an increased magnitude is provided with relatively minor additions to existing bubble domain systems or organizations. When the configurations shown in FIGS. 2 and 3 are utilized, the detector provides a better no bubble output signal.

Of course, it is understood that those skilled in the art may make certain modifications to the specific detector construction. For example, device structures other than chevrons may be desired. The number of detector segments which are connected together may be varied in order to obtain a prescribed magnitude of output signals. In addition, depending upon the operating characteristics of the magnetic domain material, it may be desirable to interconnect a determinable number of segments as a function of the bubble expansion characteristics and the like. However, any modifications which fall within the purview of the instant description are intended to be included therein as well.

Having thus described a preferred embodiment of the invention, what is claimed is:

1. In combination,
a plurality of bubble domain detector means connected in series,
propagation track means,
a plurality of passive replicator means coupled with said propagation track means, and
propagation paths interconnecting each of said replicator means to a separate one of said detector means,
said propagation paths between said replicator means and said detector means being of different length.

2. The combination recited in claim 1 wherein
each of said detector means comprises an active and a dummy portion,
said active and dummy portions being of substantially similar length,
said dummy portion comprising a plurality of spaced apart sections.

3. The combination recited in claim 2 wherein
each detector means comprises a plurality of chevron means interconnected by a detector line.

4. The combination recited in claim 2 including
a plurality of active portions connected in series and a plurality of dummy portions connected in series,
impedance means connected to said plurality of serially connected active portions and said serially connected dummy portions to form a bridge network, and
differential amplifier means connected to said bridge network to produce an output signal representative of the signal produced by said detector means.

5. The combination recited in claim 1 wherein
said propagation path to one of said detector means includes at least a portion of said propagation track means between the passive replicators associated with said detector means.

6. The combination recited in claim 1 wherein
said detector means comprise stretcher detectors connected in series wherein the output signals produced thereby are additively combined, and
said propagation paths are different in length whereby each of said detector means concurrently detects the same bubble domain.

7. The combination recited in claim 1 wherein
each of said bubble domain detector means includes a magnetoresistance line.

8. The combination recited in claim 1 wherein
each of said detector means is the same propagation distance from the first of said plurality of passive replicator means in said propagation track means.

9. In combination,
first, second and third pluralities of chevrons arranged in columnar patterns,
said first and second pluralities of chevrons disposed adjacent said third plurality of chevrons,
said first and second pluralities of chevrons spaced apart from each other,
propagation path means disposed between said first and second pluralities of chevrons and interconnected with said third plurality of chevrons, and
a first detector line coupled to the chevrons in said first and second plurality of chevrons, and
a second detector line intercoupled to the chevrons in said third plurality of chevrons,
said first and second pluralities of chevrons and the coupled first detector line exhibiting similar operational parameters to said third plurality of chevrons and the coupled second detector line.

10. The combination recited in claim 9 wherein
said first and second detector lines have substantially the same length,
said first and second pluralities of chevrons have substantially the same length as said third plurality of chevrons.

11. The combination recited in claim 9 wherein
said first and second detector lines comprise magnetoresistance lines which are integrally connected to the respective chevrons.

12. The combination recited in claim 9 wherein said propagation path means comprises a further plurality of chevrons.

* * * * *